United States Patent [19]

Black et al.

[11] Patent Number: 4,702,967
[45] Date of Patent: Oct. 27, 1987

[54] MULTIPLE-LAYER, MULTIPLE-PHASE TITANIUM/NITROGEN ADHESION/DIFFUSION BARRIER LAYER STRUCTURE FOR GOLD-BASE MICROCIRCUIT INTERCONNECTION

[75] Inventors: Jimmy C. Black; Bruce E. Roberts, both of Palm Bay, Fla.

[73] Assignee: Harris Corporation, Melbourne, Fla.

[21] Appl. No.: 874,393

[22] Filed: Jun. 16, 1986

[51] Int. Cl.[4] .................. B32B 15/04; H01L 23/54
[52] U.S. Cl. .................................. 428/620; 428/627; 428/660; 428/673; 357/71; 204/192.17; 437/246
[58] Field of Search ............... 428/620, 627, 660, 661, 428/673, 929; 427/89, 123, 125; 357/67 R, 71 R; 204/192.15, 192.17, 192.25

[56] References Cited

U.S. PATENT DOCUMENTS 3,106,489 10/1963 Lepselter .......................... 427/89
3,287,612 11/1966 Lepselter ......................... 428/660
3,879,746 4/1975 Fournier .......................... 357/71
4,226,932 10/1980 Ferraris .......................... 428/627

FOREIGN PATENT DOCUMENTS 5560 1/1985 Japan ............................. 357/67

Primary Examiner—L. Dewayne Rutledge
Assistant Examiner—John J. Zimmerman
Attorney, Agent, or Firm—Antonelli, Terry & Wands

[57] ABSTRACT

To securely attach a narrow line width electrodeposited layer of gold to an underlying semiconductor structure a thin multiphase adhesion film of nitrogen-modified titanium is formed between a titanium nitride diffusion barrier layer and an overlying gold seed layer. This additional layer nitrogen-modified titanium layer provides a titanium base to ensure adhesion of the gold, yet contains sufficient nitrogen interstitially dispersed in the thin titanium film to prevent formation of unetchable gold-titanium compounds.

16 Claims, 1 Drawing Figure

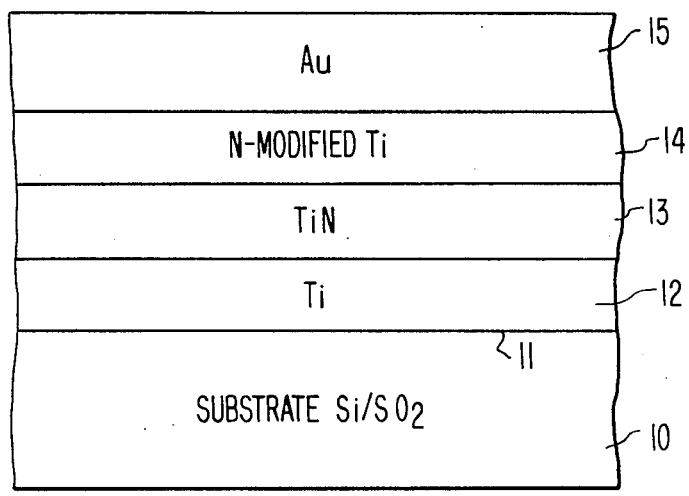

MULTIPLE-LAYER, MULTIPLE-PHASE TITANIUM/NITROGEN ADHESION/DIFFUSION BARRIER LAYER STRUCTURE FOR GOLD-BASE MICROCIRCUIT INTERCONNECTION

FIELD OF THE INVENTION

The present invention relates, in general, to semiconductor devices and is particularly directed to a mechanism for adhering a gold interconnect layer to an underlying substrate through the use of a multiple layer titanium, titanium nitride adhesion/diffusion barrier structure.

BACKGROUND OF THE INVENTION

As the evolution of microelectronics technology continues to target integrated circuit structures of reduced minimum feature size (line width), high integration density and higher signal processing speed, the flexibility (margin for error) of semiconductor wafer structure parameters has been reduced to the point where most, if not all, components have become constituent and dimension critical. For example, in semiconductor environments where signal processing speed and circuit robustness are important performance criteria, such as in very high speed integrated circuits, electroplated gold, which possesses superior conductivity and external influence immunity properties, has become the predominant choice for the interconnect medium.

The choice of gold electroplate for this purpose, however, is not without a price, as gold does not readily adhere to semiconductor (e.g. silicon dioxide) wafer structures and, consequently, requires the use of an adhesion layer such as titanium between the gold and the underlying material. As a further complication, when formed directly on the titanium layer, gold forms compounds that cannot be readily etched.

To remedy this problem the addition of a diffusion barrier of titanium nitride between the gold electroplate and the titanium layer, together with an additional barrier layer of platinum between the titanium nitride and the gold, has been suggested, as described in Fournier U.S. Pat. No. 3,879,746. In the environment to which the patented scheme is applied, the interconnect methodology involves beam lead structures in which the contact surface area of the interconnect metal and the photoresist used for its' patterning is considerably larger, and therefore less prone to delamination during plating, than the extremely narrow (sub micron) line widths of present day integrated circuit structures. Substitution of the platinum layer by a gold layer reduces the photoresist adhesion problem but introduces a loss of adhesion between the titanium nitride and the gold layers. It has been found that the titanium nitride layer employed in the patented laminate scheme does not possess the necessary adhesion strength to prevent a very narrow width noble metal layer from separating from the nitride layer when subjected to successive temperature cycles. While the adhesion mechanism is not entirely understood it is believed that the fact that the electroplated gold is tensile while the titanium nitride is compressive, together with the extremely narrow (quasi edge) contact area of the noble metal and the nitride, contributes to the tendency of the gold line to separate or peel away from the titanium nitride when subjected to repeated temperature cycling.

SUMMARY OF THE INVENTION

In accordance with the present invention the inability of conventional adhesion/diffusion barrier Ti-TiN laminates to securely maintain a narrow line width electrodeposited layer of gold to an underlying semiconductor structure is overcome by the incorporation of a thin adhesion film of nitrogen-modified titanium between the titanium nitride (specifically, titanium mononitride) diffusion barrier layer and the overlying gold layer which serves as the electroplating seed layer. In effect this additional layer nitrogen-modified titanium layer provides a titanium base to ensure adhesion of the gold, yet contains sufficient nitrogen interstitially dispersed in the thin titanium film to drastically reduce the formation of unetchable gold-titanium compounds. In accordance with a preferred embodiment of the invention the laminate structure is formed within a sputter deposition system, having gold and titanium targets and carrier (argon) and nitrogen gas inlets for successively depositing the titanium, titanium nitride, nitrogen-modified titanium film, gold laminate structure atop a semiconductor wafer. (Rather than employ a sputter deposition system, an activated reactive evaporation system may be employed.) In the course of formation of the multilayer structure, a layer of titanium is initially formed on the surface of the substrate by directing an argon sputtering gas at a titanium target at a reduced pressure. During this step and all subsequent steps the sputtering process is carried out at a prescribed RF diode power for an RF field between the target and the substrate. After deposition of the titanium layer, nitrogen gas is controllably introduced into the system and a layer of titanium nitride is formed atop the titanium layer. The nitrogen source is then ramped down and the system allowed to stabilize. Titanium is once again sputtered onto the laminate structure (specifically, the titanium nitride layer). During this step nitrogen gas at a considerably reduced pressure is mantained in the system whereby there is formed a nitrogen modified titanium thin film (have a thickness in a range of from 100 Å to 400 Å), on which the gold is to be depositied.

The gold seed layer is then formed atop the nitrogen-modified titanium film by sputtering.

BRIEF DESCRIPTION OF THE DRAWINGS

The single FIGURE is a diagrammatic cross-sectional illustration of a multilayer, multiple-phase titanium/nitrogen adhesion/diffusion barrier layer structure for a gold-base interconnect in accordance with the present invention.

DETAILED DESCRIPTION

Referring now to the single FIGURE there is shown the laminate configuration of a multi-layer titanium/titanium nitride/gold structure atop a semiconductor substrate on which a gold interconnect pattern is to be electro formed. In the explanation to follow the sequence of steps for producing the structure shown in the FIGURE will be described in detail.

The base layer upon which the multi-layer titanium/nitride/gold layer is to be formed is referenced as a semiconductor substrate (e.g. silicon, silicon dioxide, tungsten) 10 having a top surface 11. For depositing the laminate structure atop the substrate, the substrate 10 is inserted into a suitable RF enhanced sputter deposition system such as a Perkin Elmer 4400 series system. Respective titanium and gold targets are disposed at target sites within the system chamber such that the targets are in close proximity to the substrate, preferably in a range of from two to three inches target to substrate separation. A suitable carrier gas (e.g. argon) supply line is coupled to one controlled gas inlet of the system while a nitrogen gas supply line is coupled to a second controlled gas inlet.

Formation of the laminate structure shown in the FIGURE is initiated by reducing the pressure within the system to a vacuum less than a value on the order of $4 \times 10^{-7}$ Torr. A suitable sputter gas (e.g. argon) at a partial pressure of $4 \times 10^{-3}$ to $10^{-2}$ Torr is directed at the titanium target, and a titanium layer 12 is thereby deposited on the semiconductor substrate 10 which has been heated to a temperature on the order of 450° C. During this and all sputtering steps the sputtering process is conducted in an RF field at an RF diode power preferably greater than 2 Kw. After the titanium layer 12 is sputtered to the desired thickness (preferably greater than 100 Å), TiN is sputter deposited at the above set of conditions together with the inclusion of $N_2$ at a partial pressure equal to or greater than $2.5 \times 10^{-4}$ Torr, so as to form a layer 13 of titanium nitride atop the titanium layer 12. The thickness of the titanium nitride layer is preferably greater than a value on the order of 1000 Å. During the formation of the titanium nitride layer 13 the partial pressure of nitrogen gas is controlled so as to be preferably greater than $2.5 \times 10^{-4}$ Torr.

Upon completion of the deposition of titanium nitride layer 13, the flow of nitrogen is reduced and the system allowed to stabilize. Sputtering is resumed in a nitrogen partial pressure less than $2.5 \times 10^{-4}$ and preferably in a range of $9.5 \times 10^{-5}$ to $1.6 \times 10^{-4}$ Torr, whereby a thin nitrogen-modified film of titanium 14 is formed atop the titanium nitride layer 13. It has been found that the thickness of the nitrogen-modified titanium layer 14 must lie within a prescribed range of between 100 Å and 400 Å, in order to retain the sought after adhesion/barrier properties of the invention upon subsequent heat cycling.

In effect film 14 is a partially "stuffed barrier" layer in which the quantity of interstitial nitrogen in the titanium is less than that of a titanium nitride layer, such as layer 13, so that the nitrogen is not a complete barrier between the overlying gold and the titanium. However, metalurgical analysis of film 14 has revealed that the film contains sufficient nitrogen to effectively tie-up more than 10% of the available atomic titanium orbitals and thereby greatly inhibit the titanium from reacting with the gold and forming unetchable gold-titanium compounds. If the thickness of film 14 is less than 100 Å there is insufficient titanium coverage to provide the necessary adhesion with the gold. If the thickness of film 14 exceeds 400 Å, the quantity of titanium becomes excessive, so that at elevated annealing temperatures and in the presence of oxygen, the titanium diffuses through to the surface of film 14 and both oxidizes and combines with the gold to form unetchable compounds.

After the nitrogen modified titanium film 14 has been formed to a prescribed thickness in the above range of from 100 Å to 400 Å, the flow of nitrogen is cut off and gold is sputtered (using the argon sputtering gas only) to form a gold layer 15. The thickness of gold layer 15 may lie in a range of from 500 Å to 1000 Å. For values at the lower end of this range the thickness of the nitrogen-modified titanium film 14 may also correspondingly lie at the lower end of its range (i.e. in the neighborhood of 100 Å). Similarly, for values at the upper end of the range of gold thickness (1000 Å) the thickness of film 14 may lie at the upper end of its range on the order of 300 Å-400 Å. Of course, the thickness of gold layer 15 may be greater than 1000 Å, in which case the thickness of film 14 should be greater than or equal to 300 Å. It is simply a consequence that as the gold becomes thicker it becomes more difficult to etch. Thus, the 500-1000 Å range is preferred for IC applications. It is only after completion of the sputter deposition of gold layer 15 that the laminate structure is exposed to air.

Temperature cycling of the resultant structure employing a silicon dioxide or tungsten substrate 10 to a temperature on the order of 450° C. for periods of up to twenty-four hours has been found to cause no instability in the laminate structure. Auger and Rutherford backscattering analyses have revealed no penetration of gold through the multi-layer, multi-phase titanium/nitride structure. Industry-standard bond pulling tests have yielded adhesion strengths two to three times better than miniumum industry acceptable limits. Compared with the above-referenced patented scheme, therefore, the present invention offers several advantages. First and foremost, gold delamination during temperature cycling does not occur. This is particularly important for submicron line width architectures. Secondly, the need for an additional (platinum) target is obviated; only gold and titanium are used, thereby reducing process complexity. Thirdly, since gold is the only interconnect metal, increased conductivity is afforded. Moreover, the absence of additional metals (e.g. platinum) further reduces the overall thickness of the laminate, and enhances its use in IC packages.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A multiple layer structure for adhering gold to an underlying substrate comprising:
   a first layer of titanium overlying said substrate;
   a second layer of titanium nitride overlying said first layer;
   a third layer of nitrogen-modified titanium overlying said second layer and being of a thickness large enough to provide sufficient titanium for adherence with an overlying gold layer to be formed thereon but less than that which would cause titanium-gold compounds to be formed on the surface of said overlying gold layer as a result of subsequent heating; and
   a gold layer overlying said third layer.

2. A multiple layer structure according to claim 1, wherein the thickness of said third layer of nitrogen-modified titanium lies in a range of from 100 Å to 400 Å.

3. A multiple layer structure according to claim 2, wherein said gold layer has a thickness of at least 500 Å.

4. A multiple layer structure according to claim 2, wherein the thickness of said gold layer lies in a range of from 500 Å to 1000 Å.

5. A multiple layer structure according to claim 1, wherein the bulk of said third layer of nitrogen-modified titanium is characterized by the absence of a nitride compound of titanium, but contains nitrogen interstitially distributed in the titanium of said third layer.

6. A multiple layer structure according to claim 1, wherein the thickness of said first layer is greater than 100 Å and the thickness of said second layer is greater than 1000 Å.

7. A method adhering gold to an underlying substrate comprising the steps of:
(a) forming a multiple layer arrangement of titanium and titanium nitride on said substrate;
(b) forming a layer of nitrogen-modified titanium on said multiple layer arrangement, said layer having a thickness large enough to provide sufficient titanium for adherence with an overlying gold layer to be formed thereon but less than that which would cause titanium-gold compounds to be formed on the surface of said overlying gold layer as a result of subsequent heating; and
(c) forming a gold layer on said layer of nitrogen-modified titanium.

8. A method according to claim 7, wherein step (a) comprises the steps of:
(a-1) forming a layer of titanium on said substrate; and
(a-2) forming a layer of titanium nitride on said layer of titanium.

9. A method according to claim 7, wherein step (b) comprises the steps of depositing titanium on said multiple layer while introducing nitrogen into the deposited titanium such that the bulk of said layer of nitrogen-modified titanium is absent a nitride compound of titanium, but contains nitrogen interstitially distributed in the deposited titanium.

10. A method according to claim 9, wherein step (b) comprises forming said nitrogen-modified titanium to a thickness in a range of from 100 Å to 400 Å.

11. A method according to claim 8, wherein step (b) comprises the steps of depositing titanium on said multiple layer while introducing nitrogen into the deposited titanium such that the bulk of said layer of nitrogen-modified titanium is absent a nitride compound of titanium, but contains nitrogen interstitially distributed in the deposited titanium.

12. A method according to claim 11, wherein step (b) comprises forming said nitrogen-modified titanium to a thickness in a range of from 100 Å to 400 Å.

13. For use in a semiconductor device wherein a gold seed layer used in electroplating a gold interconnect layer is provided over the surface of a semiconductor structure, a method of adhering said gold interconnect layer to said structure comprising the steps of:
(a) forming a first layer of titanium on said semiconductor structure;
(b) forming a second layer of titanium nitride on said first layer of titanium;
(c) forming a third layer of nitrogen-modified titanium on said second layer, said third layer having a thickness large enough to provide sufficient titanium for adherence with an overlying gold layer to be formed thereon but less than that which would cause titanium-gold compounds to be formed with said overlying gold layer; and
forming a gold layer on said third layer of nitrogen-modified titanium.

14. A method according to claim 13, wherein step (c) comprises depositing titanium on said second layer while introducing nitrogen into the deposited titanium such that bulk of said third layer of nitrogen-modified titanium is absent a nitride compound of titanium, but contains nitrogen interstitially distributed in the deposited titanium.

15. A method according to claim 14, wherein step (b) comprises forming said nitrogen-modified titanium to a thickness in a range of from 100 Å to 400 Å.

16. A method according to claim 15, wherein step (c) comprises forming said gold layer to a thickness in a range of at least 500 Å.

* * * * *